United States Patent
Hu et al.

(10) Patent No.: US 10,804,458 B2
(45) Date of Patent: *Oct. 13, 2020

(54) BORON SEGREGATION IN MAGNETIC TUNNEL JUNCTIONS

(71) Applicants: INTERNATIONAL BUSINESS MACHINES CORPORATION, Armonk, NY (US); SAMSUNG ELECTRONICS, CO., LTD., Gyeonggi-Do (KR)

(72) Inventors: Guohan Hu, Yorktown Heights, NY (US); Younghyun Kim, Seoul (KR); Chandrasekara Kothandaraman, New York, NY (US); Jeong-Heon Park, Seoul (KR)

(73) Assignees: INTERNATIONAL BUSINESS MACHINES CORPORATION, Armonk, NY (US); SAMSUNG ELECTRONICS, CO., LTD. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/242,555

(22) Filed: Jan. 8, 2019

(65) Prior Publication Data

US 2019/0140165 A1  May 9, 2019

Related U.S. Application Data (63) Continuation of application No. 15/465,050, filed on Mar. 21, 2017, now Pat. No. 10,230,043.

(51) Int. Cl.
*H01L 43/08* (2006.01)
*H01L 27/22* (2006.01)
(Continued)

(52) U.S. Cl.
CPC ............ *H01L 43/08* (2013.01); *H01L 27/226* (2013.01); *H01L 43/12* (2013.01); *H01L 43/02* (2013.01); *H01L 43/10* (2013.01)

(58) Field of Classification Search
None
See application file for complete search history.

(56) References Cited

U.S. PATENT DOCUMENTS 8,072,800 B2   12/2011   Chen et al.
8,456,898 B2   6/2013    Chen et al.
(Continued)

FOREIGN PATENT DOCUMENTS

KR   102009010951   10/2009
KR   100975803     8/2010

OTHER PUBLICATIONS

J.W. Colby et al., Boron Segregation at Si-SiO2 Interface as a Function of Temperature and Orientation, J. Electrochem. Soc. Mar. 1976, pp. 409-412.

(Continued)

*Primary Examiner* — Charles D Garber
*Assistant Examiner* — Xiaoming Liu
(74) *Attorney, Agent, or Firm* — Tutunjian & Bitetto, P.C.; Vazken Alexanian (57) ABSTRACT

Memory devices and methods of forming the same include forming a memory stack over a bottom electrode. The memory stack has a free magnetic layer formed on the tunnel barrier layer. A first boron-segregating layer is formed directly on the free magnetic layer. An anneal is performed to cause boron to leave the free magnetic layer at an interface with the first boron-segregating layer. A top electrode is formed over the memory stack.

6 Claims, 8 Drawing Sheets

(51) Int. Cl.
*H01L 43/10* (2006.01)
*H01L 43/12* (2006.01)
*H01L 43/02* (2006.01)

(56) References Cited

U.S. PATENT DOCUMENTS

| | | | |
|---|---|---|---|
| 8,946,834 B2 | 2/2015 | Wang et al. | |
| 9,082,534 B2 | 7/2015 | Chepulskyy et al. | |
| 9,412,787 B2 | 8/2016 | Watts et al. | |
| 10,230,043 B2 * | 3/2019 | Hu | H01L 43/08 |
| 2008/0291585 A1 * | 11/2008 | Yoshikawa | B82Y 10/00 |
| | | | 360/324.11 |
| 2012/0300542 A1 * | 11/2012 | Uchida | G11C 11/161 |
| | | | 365/171 |
| 2013/0119494 A1 * | 5/2013 | Li | H01L 43/08 |
| | | | 257/421 |

OTHER PUBLICATIONS

List of IBM Patents or Patent Applications Treated as Related dated Jan. 8, 2019, 2 pages.

* cited by examiner

BORON SEGREGATION IN MAGNETIC TUNNEL JUNCTIONS

BACKGROUND

Technical Field

The present invention generally relates to magnetic tunnel junction devices and, more particularly, to removing boron from the magnetic tunnel junction element.

Description of the Related Art

Magnetoresistive random access memory (MRAM) cells may be formed using magnetic tunnel junction structures. In such a device, a "fixed" magnetic layer is separated from a "free" magnetic layer by a thin insulating barrier. When a voltage is applied across the device, electrons tunnel through the insulating barrier by quantum effects, creating a current. The orientation of the magnetization of the free layer relative to the fixed layer determines how likely an electron is to tunnel across the barrier, such that the magnetization of the free layer determines an effective resistance of the device that can be measured.

The magnetization of the free layer may be set using, e.g., spin-transfer torque. By applying a spin-polarized current to the free magnetic layer, angular momentum is transferred to the free layer and the orientation of its magnetization can be changed. In this manner, a bit of information may be stored in the MRAM cell and subsequently read out by applying a current and determining the resistance. Boron content in a cobalt-iron-boron magnetic layer is one factor in determining the tunnel magnetoresistance of the device.

SUMMARY

A method of forming a memory device includes forming a memory stack over a bottom electrode. The memory stack has a free magnetic layer formed on the tunnel barrier layer. A first boron-segregating layer is formed directly on the free magnetic layer. An anneal is performed to cause boron to leave the free magnetic layer at an interface with the first boron-segregating layer. A top electrode is formed over the memory stack.

A memory cell includes a memory stack pillar formed on a bottom electrode. The memory stack includes a fixed magnetic layer, a tunnel barrier layer on the fixed magnetic layer, and a free magnetic layer formed on the tunnel barrier layer. A boron-segregating layer is formed directly on the free magnetic layer. A top electrode is formed over the boron-segregating layer.

A memory array includes a plurality of magnetoresistive random access memory (MRAM) cells. Each MRAM cell includes a memory stack pillar formed on a bottom electrode. The memory stack pillars include a fixed magnetic layer, a tunnel barrier layer on the fixed magnetic layer, and a free magnetic layer formed on the tunnel barrier layer. A boron-segregating layer is formed directly on the free magnetic layer and a top electrode is formed over the boron-segregating layer. Control transistors are connected to respective MRAM cells, configured to control reading of information from and writing of information to the respective MRAM cell.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention use a thin layer boron-segregating layer to segregate boron from the free magnetic layer of a magnetic tunnel junction. Boron readily segregates in silicon dioxide interfaces and in grain boundaries. Thus, by depositing a boron-segregating layer of such a material in contact with the free magnetic layer, the properties of the device may be improved as described below. If the layer is thin enough, the added series resistance will be minimal.

Figure 1:
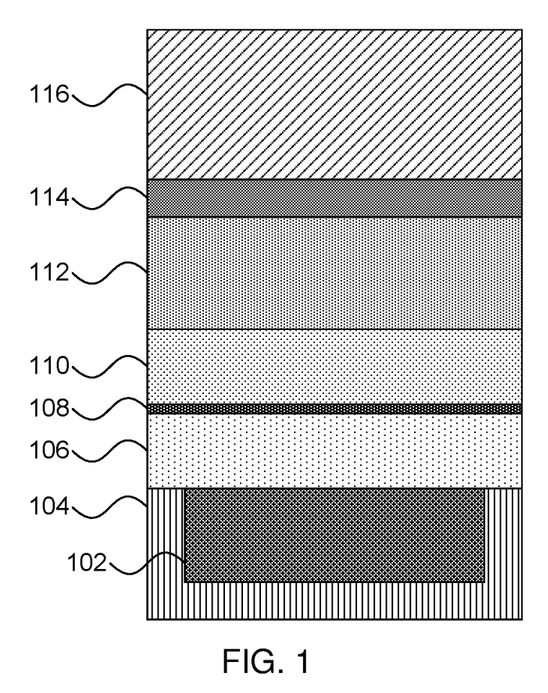
FIG. 1 is a cross-sectional diagram of a step in the formation of a magnetoresistive random access memory (MRAM) cell in accordance with one embodiment of the present invention.

Referring now to FIG. 1, a cross-sectional view of a step in fabricating an magnetoresistive random access memory (MRAM) cell is shown. A stack of dielectrics and metals is formed, from which an MRAM device will be etched. The stack may be formed by any appropriate deposition process, including for example chemical vapor deposition, atomic layer deposition, and physical vapor deposition. At the bottom of the stack, a base layer is formed from a copper channel 104, representing the underlying back-end-of-line circuitry, and a tantalum nitride landing pad 102. The base layer may have appropriate electrical connections to other devices on the chip and provides one contact for the eventual device.

A magnetic tunnel junction layer 106 is formed with a ruthenium layer 110 over it and a cap layer 108 between them. The magnetic tunnel junction layer 106 has an exemplary thickness of, e.g., about 350 angstroms, while the ruthenium ion layer 110 has an exemplary thickness of, e.g., about 200 angstroms. It should be noted that the magnetic tunnel junction layer 106 itself has multiple constituent layers, including a pinned layer, a free layer, and a tunnel barrier layer, as will be described in greater detail below. Information is stored in the magnetic tunnel junction based on the alignment or anti-alignment between magnetizations of the pinned layer and the free layer, with the magnetization of the free layer being changed by currents that tunnel through the tunnel barrier. The resistive state of the device changes with the relative magnetization, and the state of the device can thereby be read out by applying a read current.

A hardmask layer 112 formed from, e.g., tantalum nitride, is formed over the ruthenium ion layer 110 with an exemplary thickness of, e.g., about 1,000 angstroms. An oxide layer 114 is formed over the hardmask layer 112 with an exemplary thickness of, e.g., about 250 angstroms. An organic planarizing layer (OPL) 116 of e.g., HM8006, having an exemplary thickness of, e.g., about 2000 angstroms, is formed over the oxide layer 114.

Figure 2:
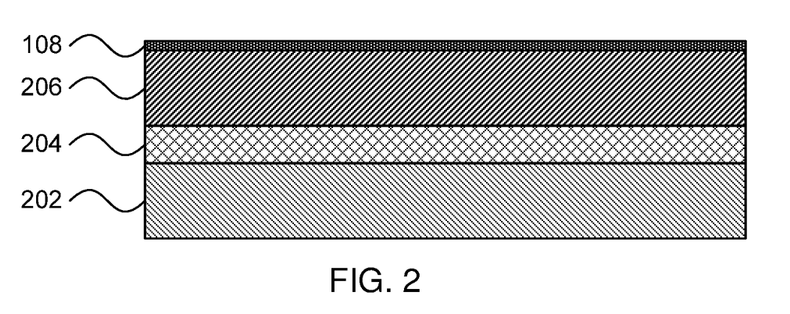
FIG. 2 is a detailed view of a magnetic tunnel junction in an MRAM cell in accordance with one embodiment of the present invention.

Referring now to FIG. 2, additional detail on the magnetic tunnel junction layer 106 and the cap layer 108 are shown. A reference layer 202 may be a single layer region that is constructed of a metal or metal alloy that includes one or more metals exhibiting high spin polarization. In alternative embodiments, exemplary metals for the formation of the reference layer 202 include iron, nickel, cobalt, chromium, boron, and manganese. Exemplary metal alloys may include the metals exemplified by the above. In another embodiment, the reference layer may be a multilayer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that may be used include a metal such as cobalt, nickel, platinum, palladium, iridium, or ruthenium, and may be arranged as alternating layers. The strong PMA region may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed.

A barrier layer 204 is formed on the reference layer 202. The barrier is formed from an appropriate insulator material and is formed at such a thickness as to provide an appropriate tunneling resistance. Exemplary materials for the barrier layer 204 include magnesium oxide, aluminum oxide, and titanium oxide, or materials of higher electrical tunnel conductance, such as semiconductors or low-bandgap insulators. The thickness of the barrier layer 204 will depend on the material selected. The first barrier layer may have an exemplary thickness of about 5 Å to about 20 Å.

A free layer 206 is formed on the barrier layer 204. The free layer 206 is formed from a magnetic material with a magnetization that can be changed in orientation relative to the magnetization orientation of the reference layer 202. Exemplary materials for the free layer 206 include alloys and/or multilayers of cobalt, iron, alloys of cobalt-iron, nickel, alloys of nickel-iron, and alloys of cobalt-iron-boron. In the present embodiments it is specifically contemplated that a cobalt-iron-boron layer is used for the free layer 206. The free layer 206 may have an exemplary thickness of about 10 Å to about 30 Å.

It should be noted that the presence of boron in the free layer 206 is useful during formation of the layer. In particular, boron facilitates the correct atomic structure for growth, whereas if only cobalt-iron is used, the layer tends to be discontinuous. A boron concentration of about 30% or higher is therefore contemplated to form a structurally robust free layer 206.

However, boron has detrimental effects on the functioning of the final device. As such, a cap layer 108 is formed on the free layer 206. The cap layer 108 is formed from, e.g., silicon dioxide and causes the boron in the free layer 206 to segregate and accumulate at the interface between the free layer 206 and the cap layer 108. Silicon dioxide has a segregation coefficient of about 1126.0 for boron. It is specifically contemplated that the cap layer 108 will be quite thin, for example between about 5 Å and about 10 Å, to minimize the series resistance added by this layer.

It should be understood that the presence of silicon dioxide at the interface of the free layer 206 makes it energetically favorable for boron to migrate out of the free layer 206. While this process will occur at room temperature, in practice an anneal between about 300° C. and about 400° C. facilitates the removal of boron.

Figure 3:
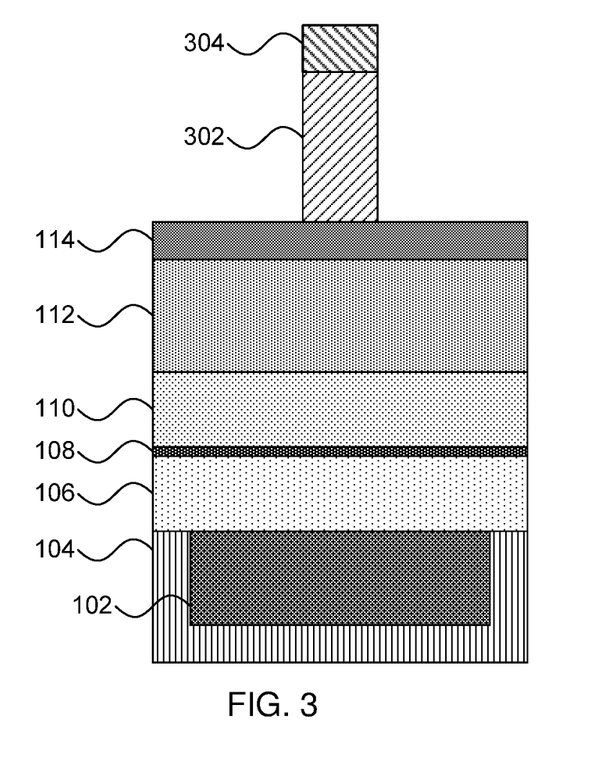
FIG. 3 is a cross-sectional diagram of a step in the formation of an MRAM cell in accordance with one embodiment of the present invention.

Referring now to FIG. 3, a cross-sectional view of a step in fabricating an MRAM cell is shown. A photoresist layer 304 is formed over the OPL 116. It is specifically contemplated that the photoresist layer may be formed from a positive tone resist such as, e.g., AIM7946. A photolithographic mask (not shown) is formed on the stack. It is specifically contemplated that 193 nm negative tone development dry lithography is used, but it should be understood that the present principles can be extended to 193 nm immersion lithography as well. The photolithographic mask is transparent in the area where a photoresist material is to remain. In this case, the photoresist layer 304 remains on the OPL 116 to define the photoresist.

The photoresist layer has an exemplary critical dimension (e.g., diameter) of about 150 nm. In one specific embodiment, it is contemplated that a positive tone photoresist material is paired with a negative tone developer and masked with a dark field reticle to produce the island of photoresist material 304, but it should be understood that the same effect can be obtained using a negative tone photoresist material, a positive tone developer, and a bright field reticle. In either case, the reticle produces an island of photoresist material with superior roundness and uniformity. In one specific embodiment, a negative tone photoresist is used with a solvent developer such as n-butyl acetate and provides superior resist image quality relative to a positive tone resist with an aqueous tetramethyl ammonium hydroxide developer.

A reactive ion etch (RIE) is performed using the photoresist layer 304 as a mask. This etch leaves a pillar of OPL 302. The resulting pillar has a critical dimension of, e.g., about 150 nm. RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

Figure 4:
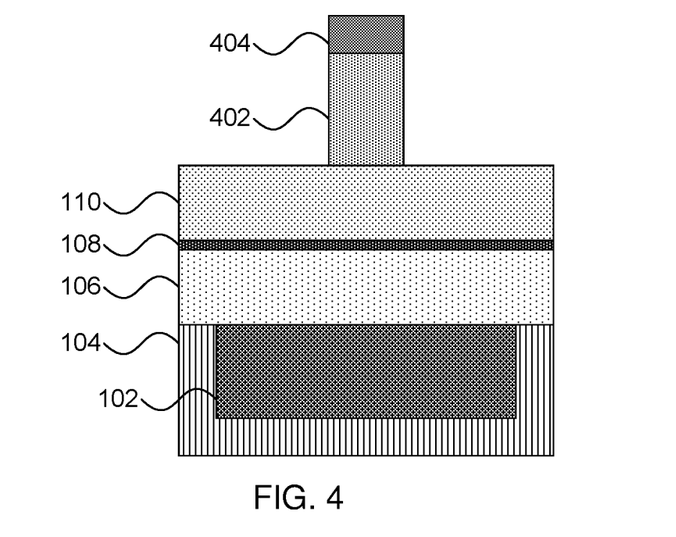
FIG. 4 is a cross-sectional diagram of a step in the formation of an MRAM cell in accordance with one embodiment of the present invention.

Referring now to FIG. 4, a cross-sectional view of a step in fabricating an MRAM cell is shown. Another RIE etch is performed using the OPL pillar 302 to pattern the metal layer 112 and oxide layer 114 to form a pillar of the metal 402 and oxide 404 having a diameter similar to that of the OPL pillar 302.

Figure 5:
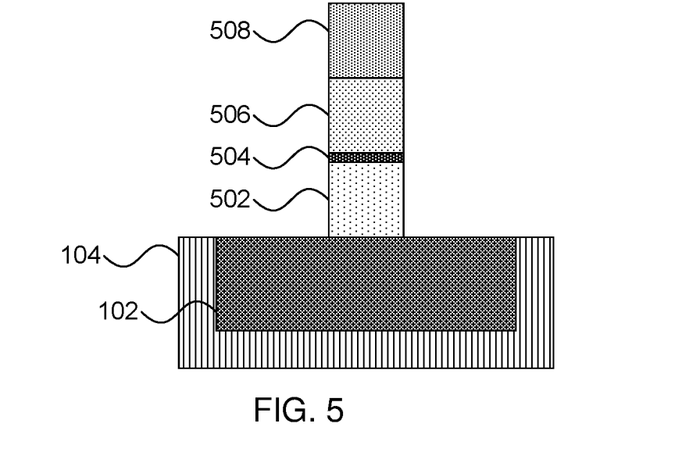
FIG. 5 is a cross-sectional diagram of a step in the formation of an MRAM cell in accordance with one embodiment of the present invention.

Referring now to FIG. 5, a cross-sectional view of a step in fabricating an MRAM cell is shown. Another RIE etch is performed, using the metal layer 402 as a hardmask for patterning the magnetic layers that form the MRAM device. This leaves a pillar of ruthenium ion layer 502, cap layer 504, and magnetic tunnel junction layer 506 with remaining metal layer 508 forming a cap having an exemplary thickness of about 750 angstroms.

Figure 6:
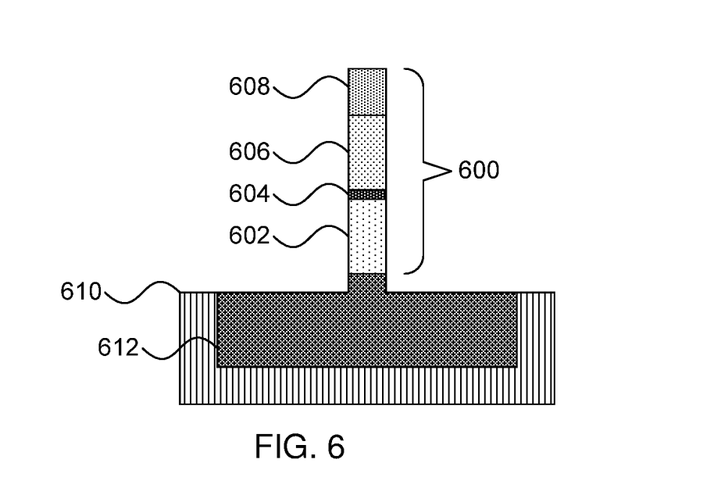
FIG. 6 is a cross-sectional diagram of a step in the formation of an MRAM cell in accordance with one embodiment of the present invention.

Referring now to FIG. 6, a cross-sectional view of a step in fabricating an MRAM cell is shown. An ion beam etch is used to reduce the diameter of the pillar 600 forming the MRAM device. The ion beam etch also cleans the sidewalls of the MRAM device 600 of any residue or damage that might remain from the earlier RIE processes. The metal layer 610 and tantalum nitride landing pad 612 is also eroded by the ion beam etch, leaving a small raised portion of the landing pad 612 under the pillar 600, which is formed from the thinned magnetic tunnel junction layer 602, cap layer 604, ruthenium ion layer 606, and conductive hardmask layer 608.

Figure 7:
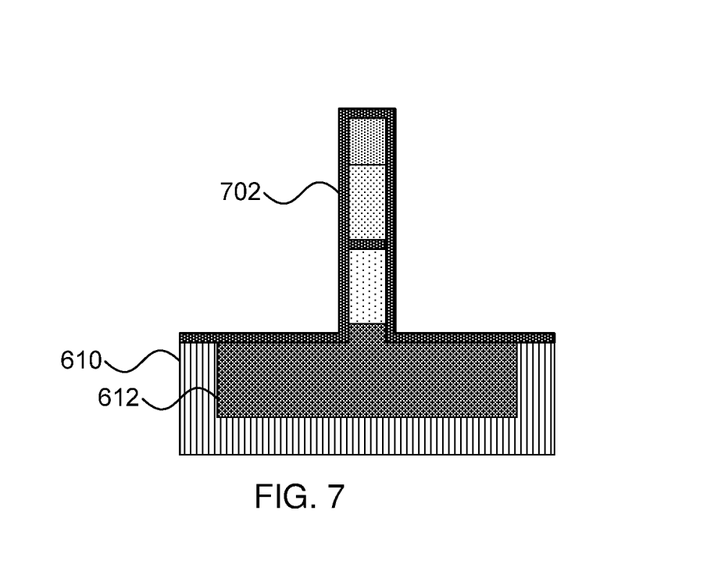
FIG. 7 is a cross-sectional diagram of a step in the formation of an MRAM cell in accordance with one embodiment of the present invention.

Referring now to FIG. 7, a cross-sectional view of a step in fabricating an MRAM cell is shown. An optional conformal layer 702 of silicon dioxide may be deposited over the pillar 600 such that the silicon dioxide layer 702 forms on the sidewalls of the magnetic tunnel junction layer 602. In this manner, additional segregation of boron from the free layer 206 can be achieved. As with the cap layer 108, the conformal silicon dioxide layer may be between about 5 Å and about 10 Å and may be formed by any appropriate conformal deposition process including, e.g., chemical vapor deposition (CVD), physical vapor deposition (PVD), or atomic layer deposition (ALD).

CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface.

Figure 8:
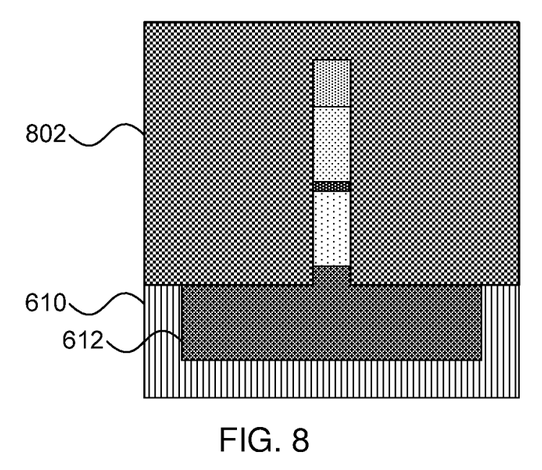
FIG. 8 is a cross-sectional diagram of a step in the formation of an MRAM cell in accordance with one embodiment of the present invention.

Referring now to FIG. 8, a cross-sectional view of a step in fabricating an MRAM cell is shown. An inter-layer dielectric 802 is deposited over the pillar 600. If the optional conformal layer 702 is included, then the inter-layer dielectric 802 is formed over the conformal layer 702. The inter-layer dielectric may be formed from any appropriate dielectric material including, e.g., silicon dioxide or silicon nitride. It is particularly contemplated that silicon nitride may be used for encapsulation, as silicon nitride provides a super barrier to diffusion.

Figure 9:
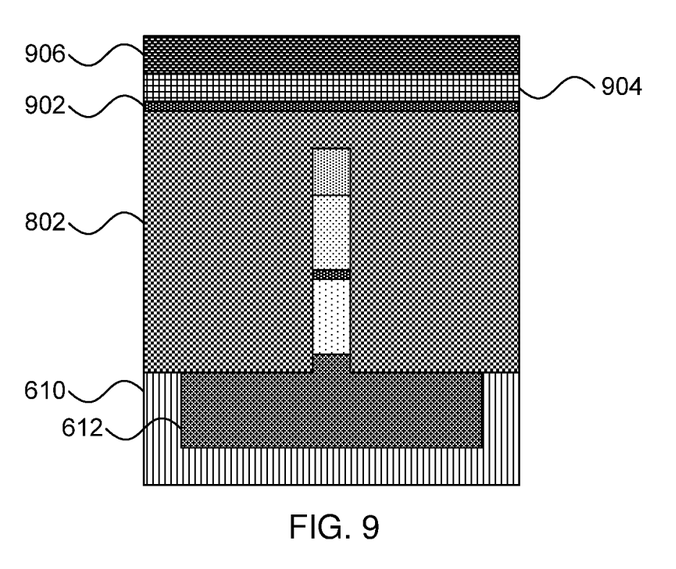
FIG. 9 is a cross-sectional diagram of a step in the formation of an MRAM cell in accordance with one embodiment of the present invention.

Referring now to FIG. 9, a cross-sectional view of a step in fabricating an MRAM cell is shown. A dielectric layer 902 is deposited on the inter-layer dielectric 802 and may be formed from, e.g., silicon dioxide at a thickness of about 20 nm. An antireflection coating (ARC) layer 904 is deposited over the dielectric layer 902 and may be a silicon-doped ARC having an exemplary thickness of, e.g., about 200 angstroms. A photoresist layer 906 is formed over the ARC layer 904. Each of these layers may be formed by any appropriate deposition process including, e.g., CVD, PVD, or ALD.

Figure 10:
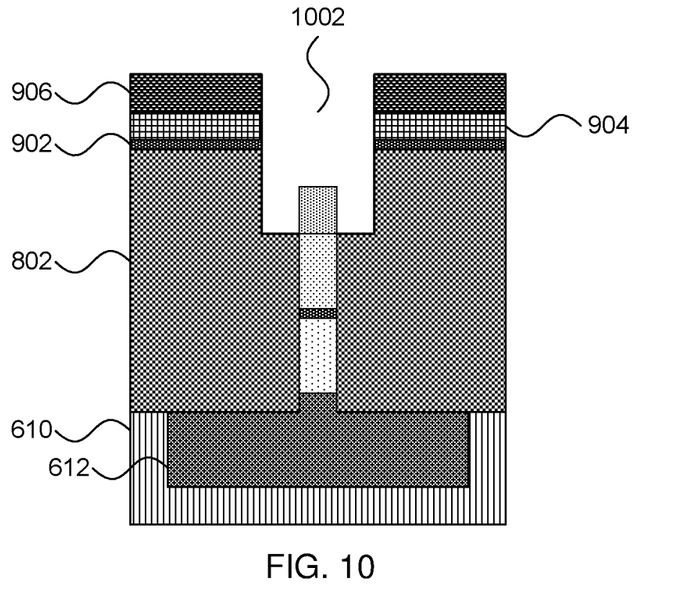
FIG. 10 is a cross-sectional diagram of a step in the formation of an MRAM cell in accordance with one embodiment of the present invention.

Referring now to FIG. 10, a cross-sectional view of a step in fabricating an MRAM cell is shown. The photoresist 906 is patterned and the ARC layer 904, the dielectric layer 902, and the inter-later dielectric 802 are etched down to form an opening 1002 that exposes the top contact layer of the pillar 600.

Figure 11:
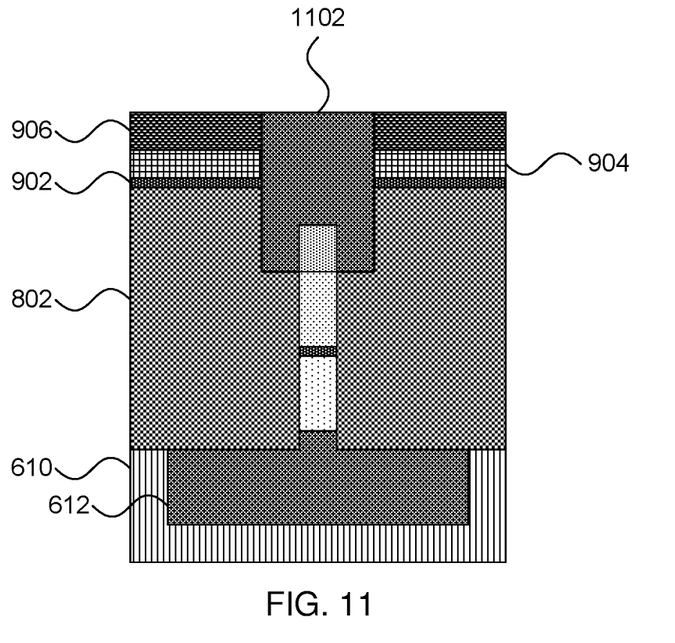
FIG. 11 is a cross-sectional diagram of a step in the formation of an MRAM cell in accordance with one embodiment of the present invention.

Referring now to FIG. 11, a cross-sectional view of a step in fabricating an MRAM cell is shown. A top electrode 1102 is deposited in the opening 1002, providing electrical connectivity to the finished device.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device use or operation in addition to the orientation depicted in the FIGS. For example, if the device in the FIGS. is turned over, elements described as "below" or "beneath" other elements or features would then be oriented "above" the other elements or features. Thus, the term "below" encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 12:
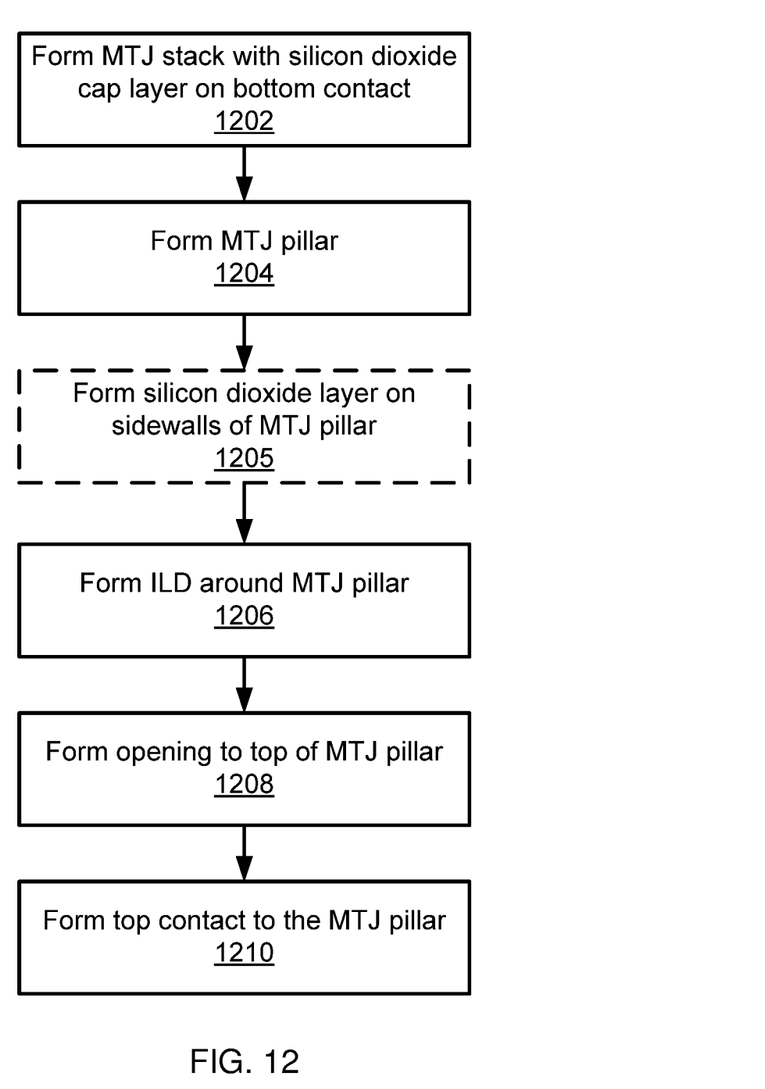
FIG. 12 is a block/flow diagram of a method of forming an MRAM cell in accordance with one embodiment of the present invention.

Referring now to FIG. 12, a method of forming an MRAM cell is shown. Block 1202 forms the magnetic tunnel junction stack 106 with the silicon dioxide cap layer 108 on top to segregate boron from the free layer 206 of the magnetic tunnel junction stack 106. Block 1204 forms magnetic tunnel junction pillar 600 from the stack of layers by, e.g., using a photolithographic mask and a directional etch. Block 1205 optionally deposits additional silicon dioxide 702 on the sidewalls of the magnetic tunnel junction pillar 600 to further segregate boron from the free layer 206.

Block 1206 forms an inter-layer dielectric 902 around the magnetic tunnel junction pillar 600. Block 1208 forms an opening 1002 through the inter-layer dielectric 902 to expose the top of the magnetic tunnel junction pillar 600. Block 1210 forms an electrode 1102 in the opening 1002 to form an electrical connection to the magnetic tunnel junction pillar 600 and complete the device.

Figure 13:
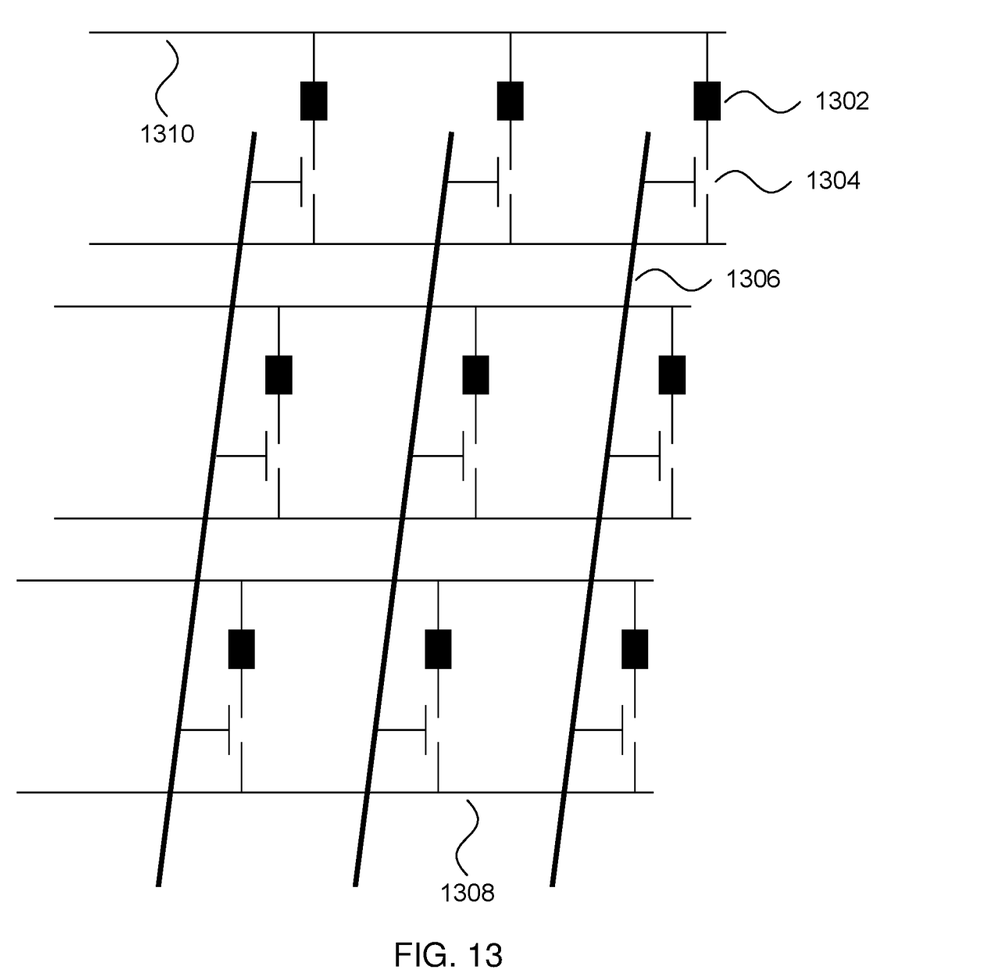
FIG. 13 is a circuit diagram of an MRAM array in accordance with one embodiment of the present invention.

Referring now to FIG. 13, an array of MRAM devices is shown. Each magnetic tunnel junction 1302 is connected to a respective transistor 1304 that controls reading and writing. A word line 1306 provides data to write to the magnetic tunnel junctions 1302, while a bit line 1310 and a bit line complement 1308 read data from the magnetic tunnel junction 1302. In this manner, a large array of memory devices can be implemented on a single chip. An arbitrarily large number of MRAM devices 1302 can be employed, within the limits of the manufacturing processes and design specifications.

Writing data to a magnetic tunnel junction 1302 includes passing a current through a MTJ. This current causes the direction of magnetization to switch between a parallel or anti-parallel state, which has the effect of switching between low resistance and high resistance. Because this effect can be used to represent the 1s and 0s of digital information, the magnetic tunnel junctions 1302 can be used as a non-volatile memory. Passing the current in one direction through the magnetic tunnel junction 1302 causes the magnetization of the free layer 206 to be parallel with that of the bottom reference layer 202, while passing the current in the other direction through the magnetic tunnel junction 1302 causes the magnetization of the free layer 206 to be antiparallel to that of the bottom reference layer 202. Reading the bit stored in a given magnetic tunnel junction 1302 involves applying a voltage (lower than that used for writing information) to the magnetic tunnel junction 1302 to discover whether the magnetic tunnel junction offers high resistance to current ("1") or low resistance ("0").

The methods and structures that have been described may be employed in any electrical device. For example, the memory devices that are disclosed herein may be present within electrical devices that employ semiconductors that are present within integrated circuit chips. Integrated circuit chips that include the disclosed interconnects may be integrated with other chips, discrete circuit elements, and/or other signal processing devices as part of either (a) an intermediate product, such as a motherboard, or (b) an end product. The end product can be any product that includes integrated circuit chips, including computer products or devices having a display, a keyboard or other input device, and a central processor.

It should be further understood that MRAM devices according to embodiments of the present principles can be employed in any computing apparatus that utilizes random access memory (RAM). For example, such computing apparatuses can utilize the MRAM devices in lieu of or in addition to RAM. Such computing apparatuses can include personal computers, mainframes, laptops, smart phones, tablet computers and other computing devices.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a memory device, comprising:
    forming a memory stack over a bottom electrode, the memory stack comprising a free magnetic layer formed on a tunnel barrier layer;
    forming a first boron-segregating layer directly on the free magnetic layer;
    forming a second boron-segregating layer directly on sidewalls of the free magnetic layer;
    performing an anneal to cause boron to leave the free magnetic layer at an interface with the first boron-segregating layer; and
    forming a top electrode over the memory stack.

2. The method of claim 1, wherein the free layer comprises cobalt-iron-boron.

3. The method of claim 2, wherein the boron-segregating layer consists of silicon dioxide.

4. The method of claim 3, wherein the boron-segregating layer has a thickness between about 5 Å and about 10 Å.

5. The method of claim 1, further comprising forming an inter-layer dielectric on the memory stack.

6. The method of claim 5, further comprising etching an opening in the inter-layer dielectric to expose a top portion of the memory stack before forming the top electrode.

* * * * *

UNITED STATES PATENT AND TRADEMARK OFFICE
CERTIFICATE OF CORRECTION

PATENT NO. : 10,804,458 B2
APPLICATION NO. : 16/242555
DATED : October 13, 2020
INVENTOR(S) : Guohan Hu and Chandrasekara Kothandaraman Page 1 of 1

It is certified that error appears in the above-identified patent and that said Letters Patent is hereby corrected as shown below:

On the Title Page

Item (72) Inventors: DELETE "Chandrasekara Kothandaraman" and INSERT
--Chandrasekharan Kothandaraman--

Signed and Sealed this
Twenty-fourth Day of August, 2021

Drew Hirshfeld
*Performing the Functions and Duties of the*
*Under Secretary of Commerce for Intellectual Property and*
*Director of the United States Patent and Trademark Office*